United States Patent [19]

Beauducel et al.

[11] Patent Number: 4,774,474
[45] Date of Patent: Sep. 27, 1988

[54] DEVICE FOR AMPLIFYING AND SAMPLING MULTIPLEXED ANALOG SIGNALS

[75] Inventors: Claude Beauducel, Henonville; Pierre Fouquet, Argenteuil, both of France

[73] Assignee: Institut Francais du Petrole, Malmaison, France

[21] Appl. No.: 947,744

[22] Filed: Dec. 30, 1986

[30] Foreign Application Priority Data

Dec. 30, 1985 [FR] France .................. 85 19426

[51] Int. Cl.[4] .................................... H03G 3/20
[52] U.S. Cl. ........................... 330/129; 330/254
[58] Field of Search ............ 330/9, 129, 88, 98, 330/254

[56] References Cited

U.S. PATENT DOCUMENTS 4,554,511 11/1985 Braun ........................... 330/129

*Primary Examiner*—Gene Wan
*Attorney, Agent, or Firm*—Antonelli, Terry & Wands

[57] ABSTRACT

A device is provided for amplifying and sampling multiplexed analog signals so as to give them an optimum level before digitization thereof. It includes several amplification and sampling assemblies with fixed gains differing from one to another, an amplifier whose gain is able to take on several predetermined values, connection means for selectively connecting one of the assemblies to said amplifier, comparison means comparing the amplitude of the signals at the output of the amplifier with threshold voltages and a selection member for choosing the assembly and the gain of the amplifier as a function of the comparison. In each of the assemblies, the amplification function is provided either by amplifier stages and/or by sample and hold units.

10 Claims, 3 Drawing Sheets

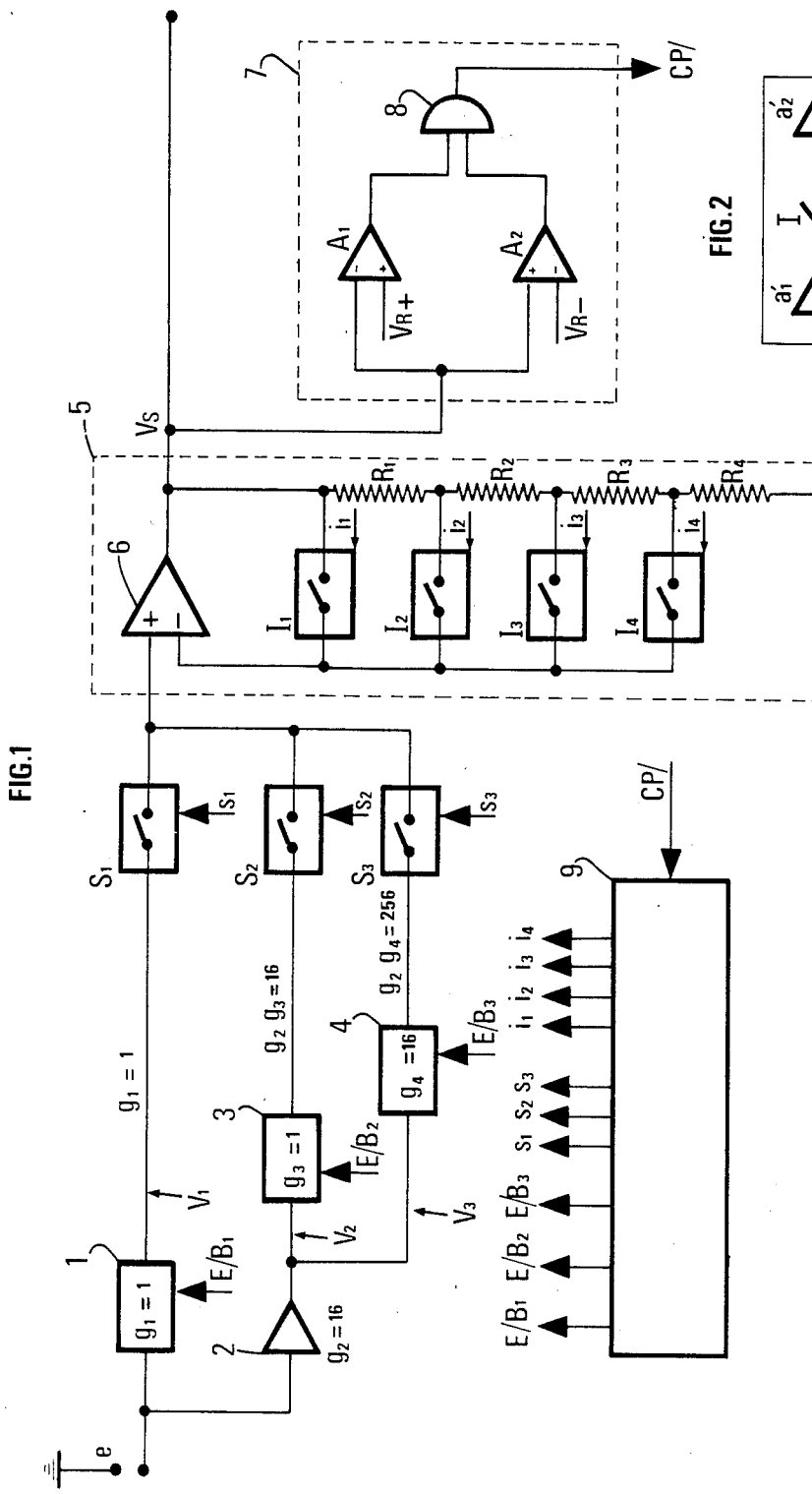

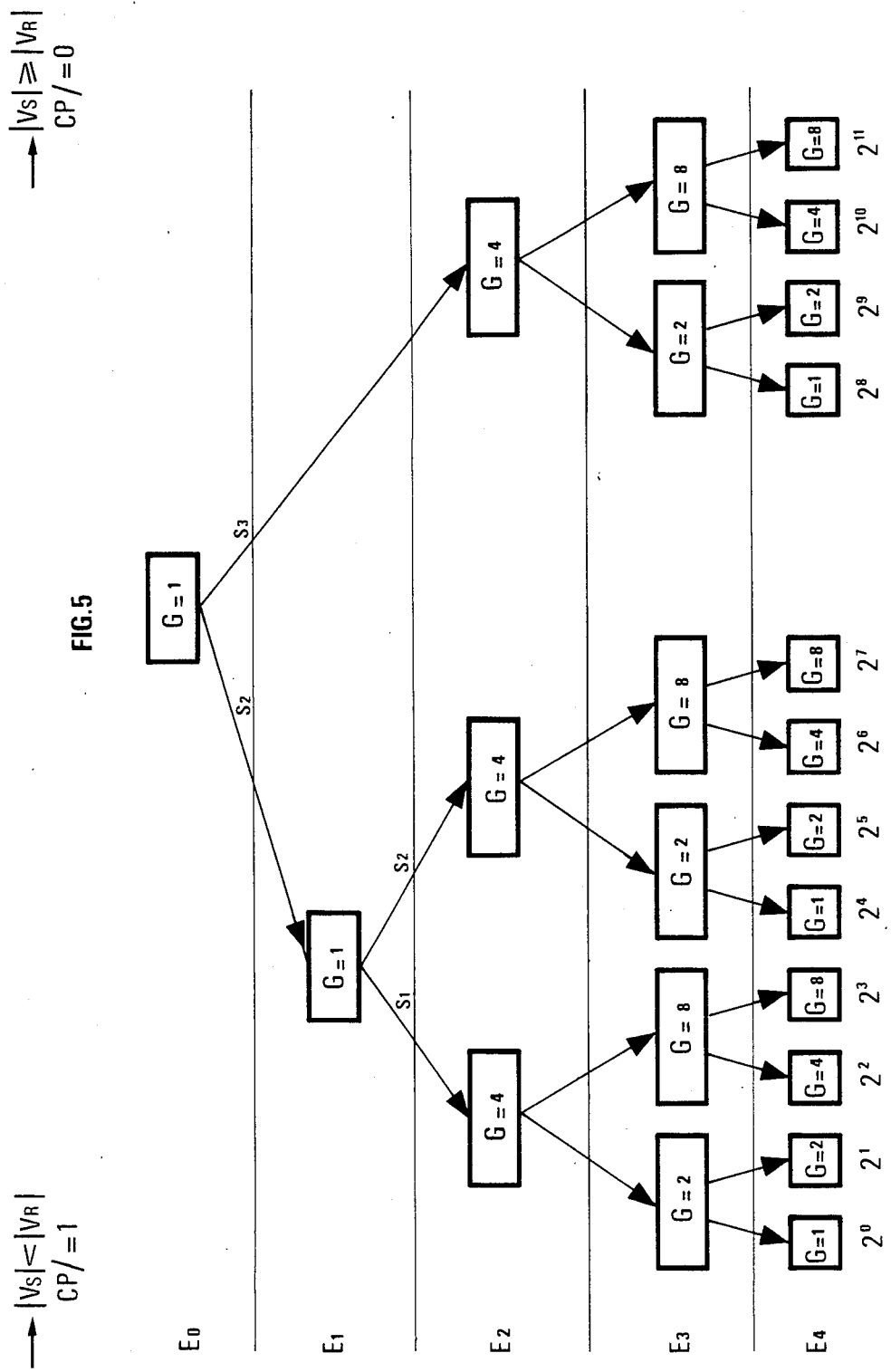

DEVICE FOR AMPLIFYING AND SAMPLING MULTIPLEXED ANALOG SIGNALS

BACKGROUND OF THE INVENTION

1. Field of the Invention

The invention relates to a device for amplifying and sampling multiplexed analog signals, more particularly seismic signals. The device may be included in a seismic data acquisition chain for amplifying and sampling the signals supplied by one or more sensors disposed inside a seismic streamer, before digitization thereof by means of an analog-digital converter and recording thereof.

2. Description of the Prior Art

In a known process, the signals from a multiplexer disposed at the head are applied to a chain of amplifer elements disposed in series, the gain of each of them being fixed. A selection member chooses the number of amplification units which each signal must pass through taking into account its amplitude, so as to reach the optimum level and switch the output of the amplification unit where this is available, to the input of an analog-digital converter. The gains of the different stages may be all identical or else all different from each other, the gain of any stage being for example equal to the square of the value of the gain of the preceding stage. Such amplification chains are described for example in French Pat. Nos. 2.110.758 or 2.373.914.

The amplifiers formed of a cascade of amplification units comprising a multiplexer at the head have numerous drawbacks. They are relatively slow because the delays occuring in the different stages through which the signals pass are accumulative and are all the greater the higher the total gain to be applied thereto. The duration of the step for selecting the output where the signal presents optimum level compatible with the analog digital converter is all the greater the longer the chain.

Furthermore, storage of the values of the samples of signals available at the output of the head multiplexer is provided by a storage element of the sample and hold unit type whose defect is generally to create diaphony between successive samples, this being all the more sensitive the greater the dynamics of the signals which are applied thereto. The errors due to diaphony occuring before the amplifier are amplified by the whole chain of amplification stages.

SUMMARY OF THE INVENTION

The device of the invention avoids the drawbacks of prior devices. It includes amplification and sampling means applying to each multiplexed signal several different amplification gains, means for comparing the amplitude of the amplified signals with predetermined threshold voltages and means for selecting among the signals of different amplification gains, the one whose gain is optimum. In this device the amplification and sampling means include three amplification and sampling assemblies whose fixed gains are different from each other, an amplifier whose gain is able to take on several given values and connection means for selectively connecting one of the three amplification and sampling assemblies in series with the amplifier, the fixed gains of the three assemblies and the given values of the gains of the amplifier being chosen so that the overall gain applied to the multiplexed signals is one of the successive powers of an elementary gain value.

In a first embodiment, the first amplification and sampling assembly includes a first sample and hold unit whose gain is equal to unity, the second includes an amplification stage with fixed gain whose output is connected to the input of a second sample and hold unit and the third includes a third sample and hold unit adapted to apply a predetermined fixed amplification gain, which is connected also to the output of said fixed gain amplification stage.

In a second embodiment, the first amplification and sampling assembly includes a first sample and hold unit whose gain is equal to unity, the second, a second sample and hold unit adapted to amplify with a predetermined fixed gain the signals which are applied thereto, the third, a third sample and hold unit also adapted to amplify with a predetermined gain the signals which are applied thereto, the three sample and hold units being connected in series, the output of one being connected to the input of the next, and their outputs being respectively connected to the connection means.

In a third embodiment, each of the three amplification and sampling assemblies includes an amplification stage with predetermined fixed gain and a sample and hold unit, the three amplification stages being interconnected in series, the output of one being connected to the input of the next and the three sample and hold units being connected respectively by their inputs to the outputs of the three amplification stages and by their outputs to the connection means.

In a preferred embodiment, the elementary gain is chosen equal to two.

The device of the invention is advantageous in that:

the sampling and amplification take place after a short cycle for selecting channels and gains involving a restricted number of elements whose gain, variable in steps, may reach very high values, $2^{11}$ for example, an appreciable part (equal to 16 or 256 for example) of the gain required for amplification is obtained by means of elements (amplification stages or sample and hold units amplifying the signals which are applied thereto) whose gain is fixed, which limits certain disturbances related to the use of analog switches and improves the accuracy, and the number of sample and hold units required is restricted and, because of their position in the amplification and sampling chain, the dynamics of the signals which are applied thereto is more reduced than in the case where a head multiplexer is used, which contributes to minimizing the diaphony between successive samples.

BRIEF DESCRIPTION OF THE DRAWINGS

Other features and advantages will be clear from the following description of embodiments given by way of non limitative examples, with reference to the accompanying drawings in which:

FIG. 1 shows schematically a first combined embodiment where the amplification gain of the different amplification and sampling assemblies is applied to the signals both by an amplification stage and a sample and hold unit;

FIG. 2 shows in greater detail the arrangement of a sample and hold unit used:

FIG. 5 shows in arborescent form the channel and gain selection diagram, for bringing every input signal to an optimum output level using any one of the preceding embodiments.

DESCRIPTION OF THE PREFERRED EMBODIMENTS

Figure 3:
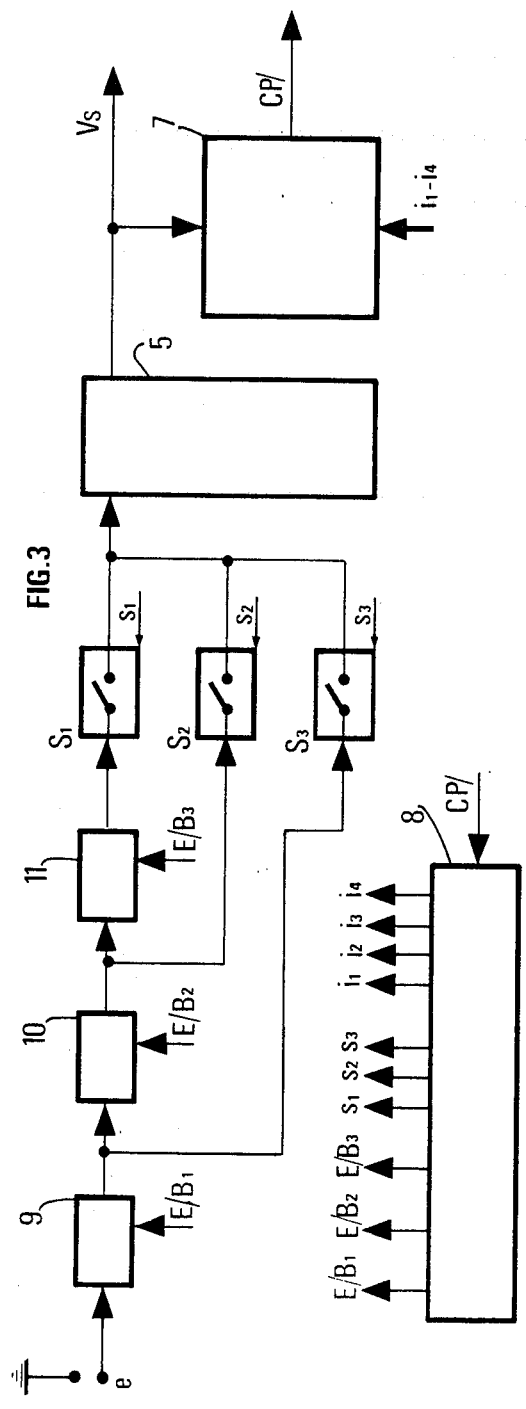
FIG. 3 shows schematically a second embodiment where the amplification gain of the different assemblies is applied by fixed gain sample and hold units.

In the preferred embodiment shown in FIG. 1, the device includes three amplification and sampling assemblies. The first one includes a sample and hold unit 1 whose gain $g_1$ is equal to unity, and which is connected to the input of the device. The second includes an amplification stage 2 whose gain $g_2$ is fixed and equal to 16, which is also connected to the input of the device. The output of the amplification stage 2 is connected to the input of a second sample and hold unit 3 whose gain $g_3$ is equal to unity. The third assembly includes a third sample and hold unit whose gain $g_4$ is equal to 16 and whose input is connected to the output of the amplification stage 2.

The sample and hold units 1, 3, 4 used are for example in the form of integrated circuits manufactured by PMI under the reference SMP 11 and by National Semi Conductor under the reference LF 198. These references of course imply no limitation. These sample and hold circuits each have (FIG. 2) two amplifiers $a_1$ and $a_2$, interconnected in series through a switch I (FIG. 2). Between a first terminal of the sample and hold unit and ground is connected a storage capacitor C. At a second terminal, a signal E/B is applied for controlling the switch I. When the logic value of this signal is equal to 0, switch I is closed and the value of the signal sample applied is loaded in the capacitor C (sampling phase). A signal with logic value equal to 1 causes opening of switch I and storage of this signal sample in the capacitor C.

By E/B1, E/B2 and E/B3 are designated respectively the control signals for the three sample and hold units 1, 3 and 4.

The outputs of the three sample and hold units are connected respectively through three electronic switches $S_1$, $S_2$, $S_3$ to the non inverting input of a second amplification stage 5 whose gain is able to take on several predetermined gain values by means of a conventional feedback network. This network includes four resistors $R_1$, $R_2$, $R_3$, $R_4$, interconnected in series, which connect the output of an amplifier 6 to ground. The inverting input of amplifier 6 is connected directly to the output thereof through a first switch $I_1$ and to the interconnection point of resistors $R_1$ and $R_2$ and to a second switch $I_2$. Similarly, it is connected to the interconnection point of resistors $R_2$ and $R_3$ through a third switch $I_3$ and to that of resistors $R_3$ and $R_4$ through a fourth switch $I_4$.

The values of the resistors $R_1$ to $R_4$ are chosen so as to give selectively to the amplification stage 5 a gain G equal to 1, 2, 4 or 5 by respectively closing the switches $I_1$, $I_2$, $I_3$ or $I_4$.

The choice of the gain for giving an optimum level to the signals from the amplification stages is obtained by appropriately selecting the switches $S_1$, $S_2$, $S_3$ and switches $I_1$, $I_2$, $I_3$. This selection is provided as a function of a signal CP/ coming from a comparison element 7 of a known type including for example two comparison amplifiers $A_1$, $A_2$ adapted for comparing the output voltage $V_S$ of the amplification stage 5 with two reference voltages of the same absolute value, one positive $V_{R+}$, the other negative $V_{R-}$. The outputs of the comparison amplifiers $A_1$, $A_2$ are connected to the inputs of an OR gate 8. The signal CP/M delivered by this gate is different depending on whether the output signal of the chain is situated between the two symmetrical reference voltages $V_{R+}$, $V_{R-}$, or is greater than $V_{R+}$ or less than $V_{R-}$. By convention, the signal CP will have the logic value 0 when $|V_S| \geq V_R$ and the logic value 1 when $|V_S| < V_R$, $V_R$ being the absolute value common to the voltages $V_{R+}$ and $V_{R-}$.

The signal CP/ delivered by the comparison element 7 is applied to a selection assembly 9 formed of interconnected logic elements. This selection assembly 9 is adapted for generating the control signals E/B1, E/B2, E/B3 for the sample and hold units 1, 3 and 4, as well as the signals $A_1$, $A_2$, $A_3$, controlling the switches $S_1$, $S_2$, $S_3$ and those ($i_1$, $i_2$, $i_3$, $i_4$) controlling switches $I_1$ to $I_4$, in agreement with the selection diagram of FIG. 5 and the sets of logic equations which will be defined hereafter.

Each cycle for amplifying a signal sample applied to the input of the device includes:

a previous sampling step $E_0$ in which the input signal is applied to the sample and hold unit 1 and the signal amplified with a gain of 16 coming from amplification stage 2 is applied to the sample and hold units 3 and 4, four subsequent steps $E_1$, $E_2$, $E_3$ and $E_4$ for storing and selectively applying one of the stored voltages to the amplification stage 5. During these four steps, the gain to be applied to this stage is chosen and the appropriate switches $S_1$, $S_2$, $S_3$ are chosen so as to obtain an desired output voltage that is optimum when the voltage is compatible with the maximum level required by the elements situated downstream (analog-digital converter for example).

In the rest of the description, the control signal for any switch S ($S_1$ to $S_3$) or switch I ($I_1$ to $I_4$) will be designated by: S or I with the appropriate numerical reference. When this signal has the logic value 1, the switch S or the switch I which it controls will be closed. Conversely, the logic value 0 will correspond to opening thereof. It will be recalled that by convention CP/=1 means that $|V_S| < V_R$ and that CP/=0 means that $|V_S| \geq V_R$.

The objective being to give to the sampled signal the degree of amplification required for bringing it to a voltage included in a range chosen beforehand ($V_{R-}$ to $V_{R+}$), the samples are processed in successive steps, as follows:

Step $E_0$ (cf. FIG. 5)

The selection assembly applies to the sample and hold units 1, 3, 4 signals E/B1, E/B2, E/B3 of logic level 0 for closing the switch I of each of them (FIG. 2), it closes the switch $S_3$ and stores the value CP/0 taken by the comparison signal during step $E_0$.

The following logic equations sum this up.

$$\begin{cases} E/B1 = E/B2 = E/B3 = 0 \\ s_1 = s_2 & i_1 = 1 \, (G = 1) \\ s_3 = 1 & i_2 = i_3 = i_4 = 0 \\ CP/ \to CP/0 \end{cases}$$

Step $E_1$

The selection assembly 9 applies signals E/B1, E/B2, and E/B3 of logic level 1 so as to open the switches I of the sample and hold units 1, 2, 4 and store the amplitudes of the samples in the capacitors C (FIG. 2). The switch $I_1$ is kept closed so as to maintain for the amplifier stage 5 a gain equal to unity. Switch $S_1$ is kept open. The state of switches $S_2$ and $S_3$ depends on the value CP/0 stored during the preceding step and on the conjugate $\overline{CP/0}$ of this value. The new value CP/1 taken by the comparison signal during step $E_1$ is stored. Step $E_1$ is summed up by the following logic equations:

$$\begin{cases} E/B1 = E/B2 = E/B3 = 1 \\ s_1 = 0 & i_1 = 1 \ (G = 1) \\ s_2 = \overline{CP/0} & i_2 = i_3 = i_4 = 0 \\ s_3 = CP/0 \end{cases}$$

$$CP/ \rightarrow CP/1$$

Step $E_2$

Sample and hold units are kept in the holding state. The position of the three switches $S_1$, $S_2$, $S_3$ depends on the values CP/0 and CP/1 taken by the comparison signal during the two preceding steps and on their conjugates $\overline{CP/0}$ and $\overline{CP/1}$. Switch $I_3$ is closed so as to give to stage 5 a gain equal to 4. The value CP/2 taken by the comparison signal is also stored.

We end up with the following logic equations for this step:

$$\begin{cases} E/B1 = E/B2 = E/B3 = 1 \\ s_1 = \overline{CP/0} \cdot CP/1 & i_3 = 1 \ (G = 4) \\ s_2 = \overline{CP/0} \cdot CP/1 & i_1 = i_2 = i_4 = 0 \\ s_3 = CP/0 \end{cases}$$

$$CP/ \rightarrow CP/2$$

Step $E_3$

The sample and hold units are still in the storage position. Switches $S_1$ to $S_3$ are kept in their preceding state and swtich $I_3$ or $I_4$ is closed so as to give to the amplification stage 5 a gain of four or eight depending on the value of the comparison signal CP/2 and on its conjugate stored at the end of step $E_2$. The new value CP/3 of this signal is stored.

The selections performed are summed up by the following logic equations:

$$\begin{cases} E/B1 = E/B2 = E/B3 = 1 \\ s_1 = \overline{CP/0} \cdot \overline{CP/1} & i_1 = i_2 = 0 \\ s_2 = \overline{CP/0} \cdot CP/1 & i_3 = CP/2 \ (G = 8) \\ s_3 = CP/0 & i_4 = \overline{CP/2} \ (G = 2) \end{cases}$$

Step $E_4$

The sample and hold units are kept in the same holding state. The state of switches $S_1$, $S_2$, $S_3$ is not modified. The amplifier stage 5 is given a gain equal to 1, 2, 4 or 8 depending on the logic values of the comparison signal and on its conjugate stored at the end of the preceding steps.

Step $E_4$ is summed up by the following logic equations:

$$\begin{cases} E/B1 = E/B2 = E/B3 = 1 \\ s_1 = \overline{CP/0} \cdot \overline{CP/1} & i_1 = \overline{CP/2} \cdot \overline{CP/3} \ (G = 1) \\ s_2 = \overline{CP/0} \cdot CP/1 & i_2 = \overline{CP/2} \cdot CP/3 \ (G = 2) \\ s_3 = CP/0 & i_3 = CP/2 \cdot \overline{CP/3} \ (G = 4) \end{cases}$$

$$s_4 = CP/2 \cdot CP/3 \ (G = 8)$$

It can be seen from the selection diagram of FIG. 3 that the preceding succession of comparison steps and successive switching allows a gain to be applied rapidly to the input signal by successive powers of 2 from $2^0$ up to $2^{11}$ and chosen so that the amplitude of the amplified signal is in the range of values imposed by the reference voltages $V_{R+}$ or $V_{R-}$.

The selection assembly is entirely defined by the above different sequences of logic equations and by the selection diagram of FIG. 5. The arrangement of logic elements for carrying out these sequences may then be readily found by specialists.

In the combined embodiment of FIG. 3 the fixed gain amplification of the input signals is provided by an amplification stage 2 and a sample and hold unit 4 applying a gain equal to 16 to the signals from said stage.

Figure 4:
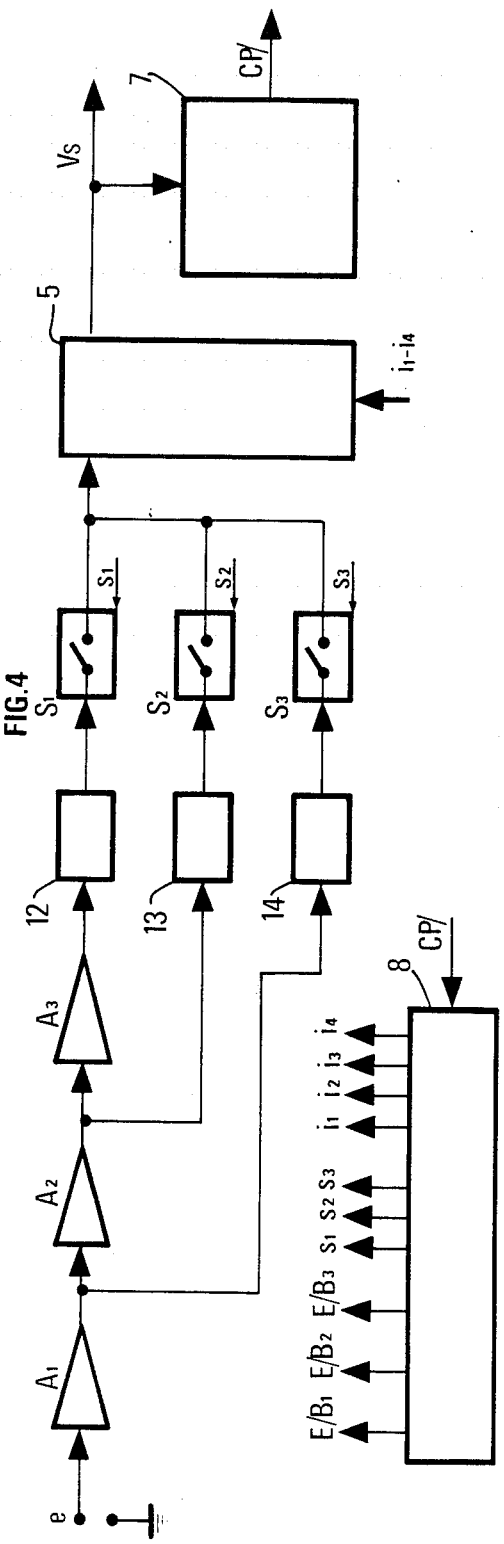
FIG. 4 shows schematically a third embodiment where the amplification gain of the different assemblies is applied solely by fixed gain amplification stages.

Still within the scope of the invention the two variants shown in FIGS. 3 and 4 may be used applying input signals to the fixed gain sampling and amplification means.

In the variant shown in FIG. 3, amplification and sampling are performed solely by sample and hold units. The input signals are applied to three sample and hold units 9, 10, 11, interconnected in series, the output of one being connected ot the input of the next. The first one (9) applies a unity gain to the signals. The next two (10,11) each have a gain equal to 16. Thus three amplified signals are available at the outputs of the three sample and hold units having respectively gains equal to 1, 16 and 256.

The outputs of the three sample and hold units are connected to the input of the variable gain amplifier stage 5 by means of three switches $S_1$, $S_2$, $S_3$. The elements 5, 7, 8 are identical to the corresponding elements of the first embodiment and the amplification and sampling cycle is the same as before.

In the variant of FIG. 4, the amplification is provided entirely by amplification stages, the sample and hold units having a gain equal to unity. The input signals are applied to three amplification stages $A_3$, $A_4$, $A_5$ interconnected in series, the output of one being connected to the input of the next. The gain of the first one ($A_3$) is equal to unity, that of the next two ($A_4$, $A_5$) is equal to 16. The signals available at their respective outputs are applied to the inputs of three sample and hold units 12, 13 and 14 whose gain is equal to 1. The sampled signals are applied to the input of the amplification stage 5 through three switches $S_1$, $S_2$, $S_3$. The element 5, 7 and 8 are the same as before. The operating cycle of this second variant is identical.

What is claimed is:

1. In a device for amplifying and sampling high dynamic multiplexed signals so as to give the signals a desired amplitude before application thereof to an analog-digital converter, including amplification and sampling means applying several different amplification gains to each multiplexed signal, means for comparing the amplitude of the amplified signals with predetermined threshold voltages and means for selecting from the signals of different amplification gains that one whose gain gives the desired amplitude, said amplification and sampling means include three amplification and sampling assemblies whose fixed gains differ from one to another, a variable gain amplifier whose gain is able to take on several given values and connection means for selectively connecting one of the three amplification and sampling assemblies in series with said variable gain amplifier, the fixed gains of the three assemblies and the given values of the gain of the variable gain amplifier being chosen so that the overall gain applied to the multiplexed signals is one of the successive powers of an elementary gain value.

2. The device as claimed in claim 1, wherein the first amplification and sampling assembly includes a first sample and hold unit with a gain equal to unity, the second includes an amplification stage with fixed gain whose output is connected to the input of a second sample and hold unit and the third includes a third sample and hold unit adapted for communicating a predetermimed fixed amplification gain, the input of the third sample and hold unit being also connected to the output of said amplification stage.

3. The device as claimed in claim 1, wherein said first amplification and sampling assembly includes a first sample and hold unit with a gain equal to unity, the second, a second sample and hold unit adapted for amplifying with a predetermined fixed gain the signals which are applied thereto, the third, a third sample and hold unit also adapted for amplifying with a predetermined gain the signals which are applied thereto, the three sample and hold units being connected in series, the output of one being connected to the input of the next and their ouputs being connected respectively to said connection means.

4. The device as claimed in claim 1, wherein each of said three amplification and sampling assemblies includes an amplification stage with predetermined fixed gain and a sample and hold unit, the three amplification stages being interconnected in series, the output of one being connected to the input of the next and the three sample and hold units being respectively connected by their inputs to the outputs of the three amplification stages and by their outputs to said connection means.

5. The device as claimed in one of claims 1 to 4, wherein said elementary gain is chosen equal to two.

6. The device as claimed in claim 5, wherein the gains of said amplification stages or of the sample and hold units are equal either to unity, or to twice the maximum gain of said variable gain amplifier.

7. The device as claimed in claim 2, wherein the gain of said fixed gain amplification stage and that of the third sample and hold unit are both equal to twice the maximum gain of said variable gain amplifier.

8. The device as claimed in claim 3, wherein the gains of said second and third sample and hold units are both equal to twice the maximum gain of said variable gain amplifier.

9. The device as claimed in claim 4, wherein the gains of said second and third amplification stages of the series are both equal to twice the maximum gain of said variable gain amplifier.

10. The device as claimed in claim 1, wherein said comparison means include amplifiers for comparing the amplitude of the signal from said variable gain amplifier with two reference voltages.

* * * * *